(12) United States Patent
Wald et al.

(10) Patent No.: US 8,849,372 B2
(45) Date of Patent: Sep. 30, 2014

(54) METHOD FOR MAGNETIC RESONANCE IMAGING USING STIMULUS INDUCED ROTARY SATURATION WITH A CONTRAST AGENT

(75) Inventors: Lawrence L. Wald, Cambridge, MA (US); Thomas Witzel, Cambridge, MA (US); Bruce R. Rosen, Lexington, MA (US)

(73) Assignee: The General Hospital Corporation, Boston, MA (US)

( * ) Notice: Subject to any disclaimer, the term of this patent is extended or adjusted under 35 U.S.C. 154(b) by 468 days.

(21) Appl. No.: 12/276,082

(22) Filed: Nov. 21, 2008

(65) Prior Publication Data

US 2009/0123384 A1     May 14, 2009

Related U.S. Application Data (63) Continuation-in-part of application No. 11/944,062, filed on Nov. 21, 2007.

(60) Provisional application No. 60/875,661, filed on Dec. 19, 2006, provisional application No. 60/860,656, filed on Nov. 22, 2006, provisional application No. 60/989,704, filed on Nov. 21, 2007, provisional application No. 61/049,933, filed on May 2, 2008.

(51) Int. Cl.
| | |
|---|---|
| *A61B 5/05* | (2006.01) |
| *G01R 33/563* | (2006.01) |
| *G01R 33/561* | (2006.01) |
| *G01R 33/56* | (2006.01) |
| *G01R 33/48* | (2006.01) |

(52) U.S. Cl.
CPC ........ *G01R 33/5601* (2013.01); *G01R 33/5635* (2013.01); *G01R 33/5615* (2013.01); *G01R 33/5602* (2013.01); *G01R 33/5616* (2013.01); *G01R 33/4806* (2013.01)
USPC ............................ 600/420; 324/307; 324/309

(58) Field of Classification Search
USPC ................. 600/409–411, 420, 431, 443, 458; 977/745, 768, 929, 960; 324/307, 309, 324/310
See application file for complete search history.

(56) References Cited

U.S. PATENT DOCUMENTS

| | | | | |
|---|---|---|---|---|
| 5,170,120 | A | * | 12/1992 | Barbara et al. ................ 324/307 |
| 5,285,156 | A | * | 2/1994 | Bodenhausen et al. ....... 324/307 |
| 5,530,348 | A | | 6/1996 | Heflinger |
| 5,825,186 | A | * | 10/1998 | Ehman et al. ................. 324/309 |

(Continued)

OTHER PUBLICATIONS

P. X. Gao, et al., "High-Yield Synthesis of Single-Crystal Nanosprings of ZnO", Small, 1:945-949, 2005.

(Continued)

*Primary Examiner* — Unsu Jung
*Assistant Examiner* — Michael N Fisher
(74) *Attorney, Agent, or Firm* — Quarles & Brady, LLP (57) ABSTRACT

A method and system for producing an image of a subject with a magnetic resonance imaging (MRI) system, in which the presence of a contrast agent is detected using a spin-lock pulse sequence, is described. More specifically, a contrast agent that induces saturation of magnetic resonance signals responsive to a spin-lock condition is administered to a subject. A spin-lock condition is subsequently established to saturate spins in proximity to the contrast agent. Image data is then acquired with an imaging pulse sequence and images indicative of the presence of the contrast agent are reconstructed.

14 Claims, 3 Drawing Sheets

(56) References Cited

U.S. PATENT DOCUMENTS

| | | | |
|---|---|---|---|
| 6,117,454 A * | 9/2000 | Kreuter et al. | 424/490 |
| 6,466,814 B1 * | 10/2002 | Ardenkjaer-Larsen et al. | 600/420 |
| 6,496,005 B2 | 12/2002 | Heid | |
| 6,836,114 B2 | 12/2004 | Reddy et al. | |
| 7,064,545 B2 * | 6/2006 | Zaharchuk et al. | 324/307 |
| 7,442,372 B2 * | 10/2008 | Kakkis | 424/94.61 |
| 2003/0170747 A1 * | 9/2003 | Janigro et al. | 435/7.21 |
| 2004/0028613 A1 * | 2/2004 | Quay | 424/45 |
| 2005/0048047 A1 * | 3/2005 | Kakkis | 424/94.61 |
| 2005/0122102 A1 * | 6/2005 | Reddy et al. | 324/307 |
| 2005/0130167 A1 * | 6/2005 | Bao et al. | 435/6 |
| 2006/0254501 A1 * | 11/2006 | Wang et al. | 117/68 |
| 2007/0188172 A1 * | 8/2007 | Garwood et al. | 324/310 |
| 2008/0019984 A1 | 1/2008 | Shusta et al. | |

OTHER PUBLICATIONS

X. Y. Kong, et al., Polar-surface dominated ZnO Nanobelts and the Electrostatic Energy Induced Nanohelixes, Nanosprings, and Nanospirals, Appl. Phys. Letts., 84:975-977, 2004.

X. Y. Kong, et al., "Spontaneous Polarization-Induced Nanohelixes, Nanosprings, and Nanorings of Piezoelectric Nanobelts", Nano Letters, 3:1625-1631, 2003.

James Friend, et al., "Surface acoustic wave concentration of microparticle and nanoparticle suspensions", 16th Australasian Fluid mechanics Conference, 1038-1041, Dec. 2-7, 2007.

Austin M. Derfus, et al., "Remotely Triggered Release from Magnetic Nanoparticles", Advanced Materials, 19:3932-3936, 2007.

Carlo Emanuele Neumaier, et al., "MR and iron magnetic nanoparticles. Imaging opportunities in preclinical and translational research", Tumori, 94:226-233, 2008.

D. K. Kim, et al. "Characterization and MRI study of surfactant-coated superparamagnetic nanoparticles administered into the rat brain", Journal of Magnetism and Magnetic Materials, 225:256-261, 2001.

Daniel L. J. Thorek, et al., "Superparamagnetic Iron Oxide Nanoparticle Probes for Molecular Imaging", Annals of Biomedical Engineering, 2006.

Justin Hulvershon, et al., "T1p Contrast in Functional Magnetic Resonance Imaging", Magnetic Resonance in Medicine, 54:1155-1162, 2005.

Thomas Witzel, et al., "Stimulus Induced Rotary Saturation (SIRS)", A New Method for the Direct Detection of Neuronal Currents with MRI.

F. Bloch, et al., "Magnetic Resonance for Nonrotating Fields", Physical Review, Mar. 15, 1940, vol. 7.

Natalia Petridou, et al., PNAS published online Oct. 12, 2006, PNAS, Oct. 24, 2006, vol. 103, No. 43, 16015-16020.

J. Bodurka, et al., "Current Induced Magnetic Resonance Phase Imaging", Journal of Magnetic Resonance 137, 265-271, 1999.

Alfred G. Redfield, "Nuclear Magnetic Resonance Saturation and Rotary Saturation and Rotary Saturation in Solids", Physical Review, vol. 98, No. 6, Jun. 15, 1955.

Arijitt Borthakur, et al., "A Pulse Sequence for Rapid in Vivo Spin-Locked MRI", Journal of Magnetic Resonance Imaging, 23:591-596, 2006.

P. A. Bandettini, et al., "Direct Detection of Neuronal Activity with MRI: Fantasy, Possibility, or Reality", Appl. Magn. Reson. 28, 1-xxx, 2005.

* cited by examiner

METHOD FOR MAGNETIC RESONANCE IMAGING USING STIMULUS INDUCED ROTARY SATURATION WITH A CONTRAST AGENT

CROSS-REFERENCE TO RELATED APPLICATIONS

This application is a continuation-in-part of Ser. No. 11/944,062, filed on Nov. 21, 2007, incorporated herein by reference and entitled "Stimulus Induced Rotary Saturation For Magnetic Resonance Functional Neuroimaging", which claims the benefit of U.S. Provisional patent application Ser. No. 60/875,661 filed on Dec. 19, 2006 and entitled "Stimulus Induced Rotary Saturation For Magnetic Resonance Functional Neuroimaging", U.S. Provisional Patent Application Ser. No. 60/860,656 filed on Nov. 22, 2006 and entitled "Stimulus Induced Rotary Saturation For Magnetic Resonance Functional Neuroimaging", and PCT Application No. PCT/US07/85403 filed on Nov. 21, 2007. This application also claims the benefit of U.S. Provisional Patent Application Ser. No. 60/989,704 filed on Nov. 21, 2007 and entitled "Stimulus Induced Rotary Saturation with a Contrast Agent for Magnetic Resonance Functional Imaging", which is incorporated herein by reference, and of U.S. Provisional Patent Application Ser. No. 61/049,933 filed on May 2, 2008 and entitled "Method for Imaging Acoustically Induced Rotary Saturation with a Magnetic Resonance Imaging System", which is incorporated herein by reference.

STATEMENT REGARDING FEDERALLY SPONSORED RESEARCH

Not applicable.

BACKGROUND OF THE INVENTION

The field of the invention is magnetic resonance imaging (MRI) methods and systems. More particularly, the invention relates to contrast-enhanced MRI methods and systems.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_{xy}$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Magnetic resonance imaging (MRI) provides images with excellent contrast between soft tissues. To further enhance this image contrast, contrast agents are typically employed. One example where contrast agents have found wide use in the field of MRI is in contrast-enhanced (CE) magnetic resonance angiography (MRA), which uses the magnetic resonance phenomenon to produce images of the human vasculature. To enhance the diagnostic capability of MRA a contrast agent, such as a gadolinium-based contrast agent, is injected into the patient prior to the MRA scan. The paramagnetic nature of gadolinium results in a decrease in the longitudinal relaxation time, $T_1$, of protons in proximity to the contrast agent. The decrease in $T_1$ is then manifested as an increase in signal intensity in a $T_1$-weighted image.

Another example of where contrast agents have found use in MRI is in perfusion imaging. As described, for example, by K. A. Kemp, et al., in "Quantification of Regional Cerebral Blood Flow and Volume with Dynamic Susceptibility Contrast Enhanced MR Imaging," Radiology, 1994; 193:637-641, it is possible to assess regional cerebral hemodynamics by analyzing MR signal intensity changes after the first pass of a paramagnetic contrast agent. While passing through the capillary network, a short bolus of the contrast agent produces local magnetic field inhomogeneities that lead to a reduction in the transverse magnetization relaxation time, $T_2^*$, of the bulk tissue. This susceptibility effect is recorded by a series of rapidly acquired $T_2^*$-weighted gradient-echo images that reveal how the MR signal changes during the first pass of the contrast agent. From this series of contrast-enhanced MR images, hemodynamic parameters such as blood flow, blood volume and mean transit time may be computed.

SUMMARY OF THE INVENTION

The present invention provides a method and system for producing an image of a subject with a magnetic resonance imaging (MRI) system, in which the presence of a contrast agent is detected using a spin-lock pulse sequence. More specifically, a contrast agent that induces saturation of magnetic resonance signals responsive to a spin-lock condition is administered to a subject. A spin-lock condition is established to saturate the spins in proximity to the contrast agent and image data acquired with an imaging pulse sequence.

It is therefore an aspect of the present invention to provide a method in which spin-locked transverse magnetization is produced as part of an imaging pulse sequence. A spin-locking field, $B_{1\rho}$, is applied to the subject to sensitize spins to changes in external magnetic fields produced by a contrast agent that oscillates at a Larmor frequency in the rotating frame, $\omega_R = \gamma B_{1\rho}$ (the so-called "spin-lock" frequency). The oscillating electromagnetic fields with spectral power at the spin-lock frequency, $\omega_R$, produce rotary saturation of the spin-locked magnetization. Thus, the contrast agent saturates the MR signal in the rotating frame during the spin-lock state. An image is subsequently reconstructed from the acquired data in which regions where the contrast agent is present appear darker.

Another aspect of the present invention provides a method for imaging a spin-lock responsive contrast agent that is freely flowing through a subject's vasculature. Images are produced having an enhanced image contrast, which allows for increased visual discrimination of the subject's vasculature.

Yet another aspect of the present invention provides a method for imaging a spin-lock responsive contrast agent that is target-specific. The contrast agent binds to a specific target site, for example a neuronal receptor, such that enhanced image contrast is attainable at the target site. In this manner, site specific image contrast is attainable. For example, the contrast agent can be bound to a ligand that attaches to dopamine receptors for imaging applications including subjects with Parkinson's disease.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

GENERAL DESCRIPTION OF THE INVENTION

The magnetic resonance (MR) principle of rotary saturation is a phenomena described for solids and liquids by A. G. Redfield in "Nuclear Magnetic Resonance Saturation and Rotary Saturation in Solids," Phys. Rev. 98, 1787 (1955). The rotary saturation effect manipulates the nuclear spin magnetization while it is rendered stationary, or "spin-locked" in the rotating frame of reference. In spin-locking methods, the equilibrium magnetization along the z-axis, coinciding with the static magnetic field $B_0$, is first tipped by a 90 degree RF pulse into the transverse x-y plane. Once in the transverse x-y plane, the magnetization is viewed as being stationary in the frame of reference with which it rotates (the rotating frame). A second resonant RF field, $B_{1\rho}$, is subsequently applied along the direction of the magnetization in the rotating frame. While this "spin-lock field", $B_{1\rho}$, is being applied, the magnetization is seen to be stationary in the rotating frame since it is aligned along $B_{1\rho}$, which is also stationary in the rotating frame. Thus, the rotating frame picture is in "equilibrium". The magnitude of the spin-locked magnetization is observed by turning off the spin-locking field, $B_{1\rho}$, and measuring the amplitude of the resulting free induction decay ("FID"). In the alternative, the spin-locking field, $B_{1\rho}$, can be turned off and the magnetization in the transverse plane flipped back up to the z-axis by a second 90 degree pulse for subsequent sampling with conventional MR imaging methods. In the latter approach, the spin-lock period is called a "spin-lock preparation".

Since the spin-locked magnetization is created by the $B_0$ field, it is much larger than the small $B_{1\rho}$ field would be able to create through true Boltzmann polarization. Thus, the spin-locked magnetization is in equilibrium in direction, but not in magnitude. As a result it will eventually relax to a much smaller value, but still be aligned along $B_{1\rho}$. This relaxation in the rotating frame has a characteristic time, $T_{1\rho}$. Typical values for $T_{1\rho}$ in vivo are hundreds of milliseconds, so the $B_{1\rho}$ state can last for several hundred milliseconds without substantial loss of magnetization. The mechanisms for $T_{1\rho}$ relaxation are analogous to normal $T_1$ relaxation: random magnetic fields fluctuating at the Larmor frequency and orthogonal to the equilibrium magnetization. While fluctuating fields in the plane transverse to the main magnetic field, $B_0$, cause $T_1$ relaxation in conventional MR imaging methods, fluctuating fields in the plane transverse to the spin-locking field, $B_{1\rho}$, cause $T_{1\rho}$ relaxation in spin-lock MRI. Since the equivalent of the Larmor precession frequency in the spin-locked state is proportional to $B_{1\rho}$, the proper frequency for efficient saturation of the magnetization is orders of magnitude lower in frequency than that needed for normal $T_1$ relaxation.

In the spin-lock state, the spins experience longitudinal and transverse relaxation from external magnetic fields, characterized by the relaxation constants $T_{1\rho}$ and $T_{2\rho}$. In one embodiment of the present invention, the external magnetic fields that are responsible for the $T_{1\rho}$ and $T_{2\rho}$ relaxation are created by an appropriate contrast agent. External magnetic field fluctuations with a significant spectral density at the rotating frame Larmor frequency during spin-lock cause resonant longitudinal relaxation of the transverse magnetization in the spin-lock state, thereby shortening $T_{1\rho}$ relative to its normal (resting state) value and reducing the spin-locked magnetization. The Larmor frequency in the rotating frame, $\omega_R$, is given by:

$$\omega_R = \gamma B_{1\rho},$$

where $\gamma$ is the gyromagnetic ratio of the nuclear spin species to be imaged, and $B_{1\rho}$ is the applied spin-lock RF field. The amplitude of the applied field $B_{1\rho}$ is set to produce oscillations in the external magnetic fields at the "spin-lock resonant frequency", $\omega_R$.

DESCRIPTION OF THE PREFERRED EMBODIMENT

Figure 1:
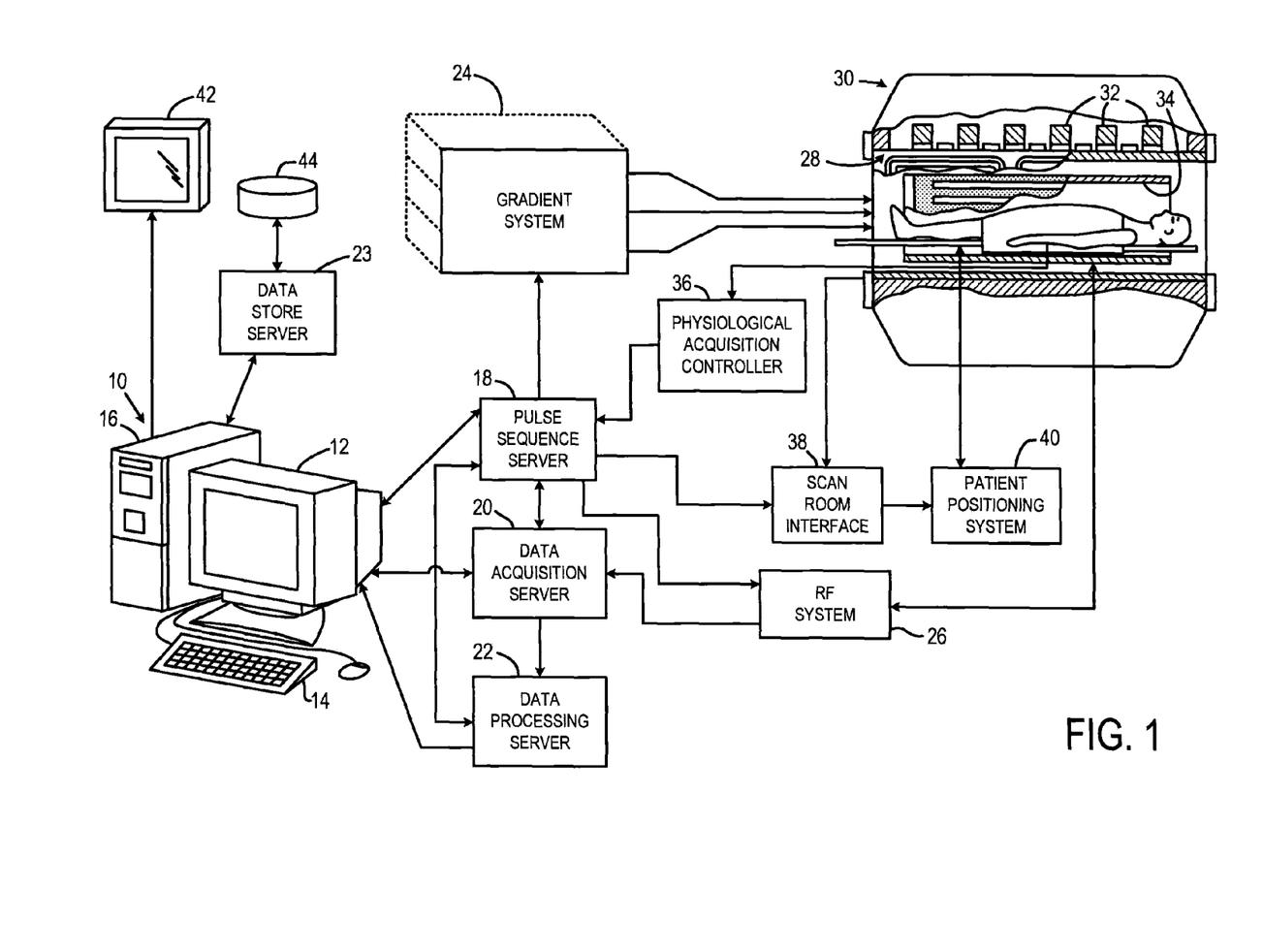
FIG. 1 is a block diagram of an MRI system which employs the present invention.

Referring particularly to FIG. 1, the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22; and a data store server 23. In the preferred embodiment the data store server 23 is performed by the workstation processor 16 and associated disc drive interface circuitry. The server 18 is performed by a separate processor and the servers 20 and 22 are combined in a single processor. The workstation 10 and each processor for the servers 18, 20 and 22 are connected to an Ethernet communications network. This network conveys data that is downloaded to the servers 18, 20 and 22 from the workstation 10, and it conveys data that is communicated between the servers.

The pulse sequence server 18 functions in response to instructions downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M = \sqrt{I^2 + Q^2},$$

and the phase of the received NMR signal may also be determined:

$$\phi = \tan^{-1}\left(\frac{Q}{I}\right).$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan. The pulse sequence server 18 also controls the operation of and devices used to stimulate the subject during the acquisition of MRI data.

The digitized NMR signal samples produced by the RF system 26 are received by the data acquisition server 20. The data acquisition server 20 operates in response to instructions downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with instructions downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
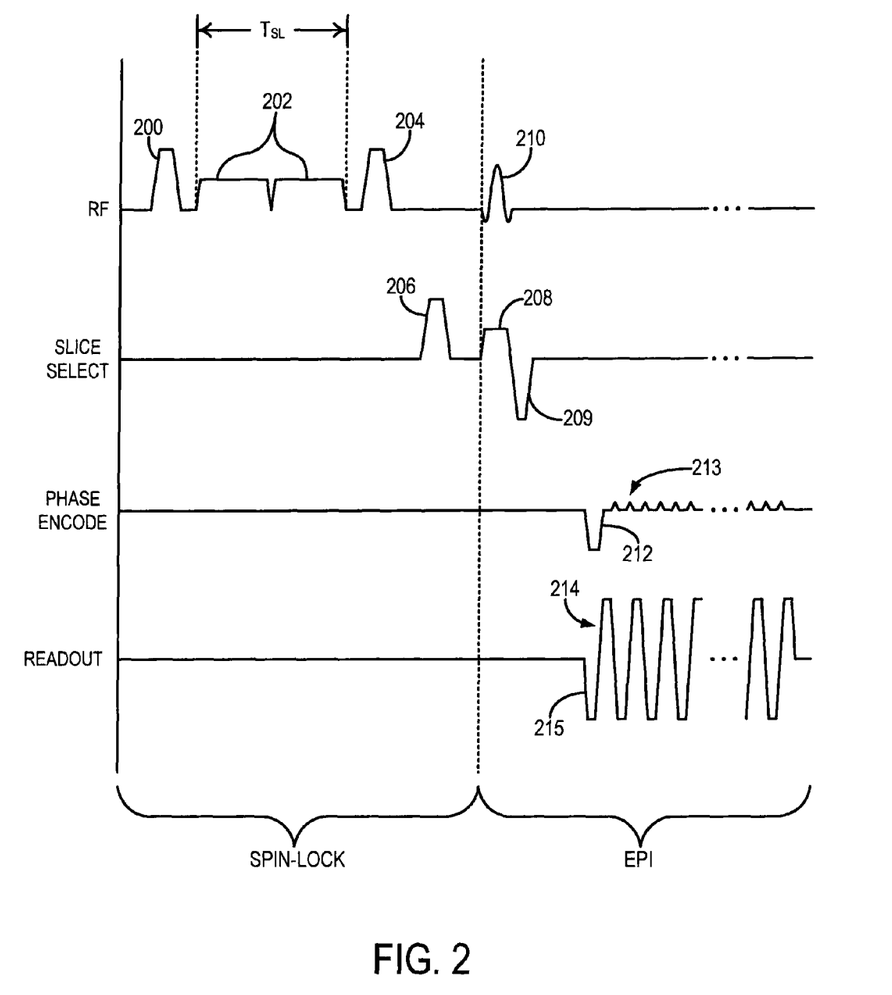
FIG. 2 is a graphic representation of an exemplary pulse sequence performed by the MRI system of FIG. 1 when practicing an embodiment of the present invention.

Referring now particularly to FIG. 2, an exemplary pulse sequence used to practice an embodiment of the present invention includes a spin-lock preparatory pulse sequence followed by an echo planar imaging (EPI) pulse sequence. The spin-lock sequence includes a nonselective 90 degree radiofrequency (RF) excitation pulse 200 that produces transverse magnetization in a subject. Subsequently, the spins producing the transverse magnetization are spin-locked in the transverse plane through the application of two phase-alternating spin-lock pulses 202 for a duration of time, $T_{SL}$. The two spin-lock pulses 202 are ±90 degree phase-shifted from the phase of the first 90 degree pulse 200. The phase-alternated spin-lock RF pulses 202 reduce image artifacts that would otherwise result from $B_1$ field inhomogeneities. The amplitude of the spin-lock pulses 202 determines the $B_{1\rho}$ field that is produced during the spin-lock condition. In the preferred embodiment of the invention the amplitude is set such that the Larmor frequency in the rotating frame, or "spin-lock" frequency, $\omega_R = \gamma B_{1\rho}$, is less than 100 Hz. Subsequent to the application of the spin-lock pulses 202, a second nonselective 90 degree RF excitation pulse 204 restores the spin-locked magnetization to the longitudinal axis. High amplitude crusher gradient pulses 206 are then applied to eliminate residual transverse magnetization. The "$T_{1\rho}$-prepared" longitudinal magnetization, $M(T_{SL})$, remaining after the application of the crusher gradient 206 is described by the equation:

$$M(T_{SL}) = M_0 e(-T_{SL}/T_{1\rho}),$$

where $M_0$ is the thermal equilibrium magnetization, $T_{SL}$ is the duration of the spin-lock pulses 202, and $T_{1\rho}$ is the longitudinal relaxation in the rotating reference frame. When employing a spin-lock pulse sequence, the longitudinal magnetization is modulated, or weighted, by changes in the $T_{1\rho}$ of the tissues being imaged.

For imaging the $T_{1\rho}$-prepared signal, a gradient-echo echo planar imaging (EPI) readout is used, in which an excitation pulse 210 is applied in the presence of a slice selective gradient 208 to produce transverse magnetization in a slice through the subject. The excited spins are rephased by a negative lobe 209 on the slice select gradient and then a time interval elapses before the readout sequence begins. A train of acquired NMR gradient recalled echoes are produced by the application of an oscillating readout gradient field 214. The readout sequence is started with a negative readout gradient lobe 215 and the echo signals are produced as the readout gradient oscillates between positive and negative values. Spatial encoding of the echoes is accomplished by a series of phase encoding gradient pulses 212. The first pulse is a negative lobe 213 that occurs before the echo signals are acquired to encode the first view with a negative k-space location. Subsequent phase encoding pulses 212 occur as the readout gradient pulses 214 switch polarity, and they step the phase encoding monotonically upward through k-space.

In one embodiment of the present invention, the EPI imaging pulse sequence is separate from the spin-lock magnetization preparation pulse sequence; however, it will be appreciated by those skilled in the art that many variations are possible. Other imaging pulse sequences can be employed after the spin-lock magnetization preparation pulse sequence, and the spin-lock magnetization preparation pulse sequence can be performed as an integral part of the imaging pulse sequence. In the latter case, the second RF pulse 204 and the crusher gradient 206 are not required and a separate RF excitation pulse is not required in the image acquisition pulse sequence that follows. In this embodiment, the imaging pulse sequence reads out the NMR signal(s) produced by the transverse magnetization at the completion of the spin-lock pulses 202.

The present invention utilizes the above-described pulse sequence to produce images indicative of saturation of the spin-lock prepared magnetization. To further enhance this effect, a contrast agent is administered to the subject such that an enhanced image contrast is produced. Some contrast agents for use in the present invention include magnetic nanoparticles containing nanoscale superparamagnetic iron oxide (SPIO) cores of magnetite and/or maghemite encased in polysaccharide, synthetic polymer, or monomer coatings. In general, when SPIO cores are placed in an external magnetic field their moments align in the direction of the magnetic field and enhance the magnetic flux. This ability to elicit substantial disturbances in the local magnetic field through large magnetic moments leads to a rapid dephasing of surrounding protons, generating a detectable change in the MR signal. Thus, in conventional imaging applications, the capability for providing improved image contrast is not from the SPIO core intrinsically, but through their influence on longitudinal and transverse relaxation of the surrounding nuclei. An advantage of including a polymer coating is that it can be modified to possess a variety of reactive moieties (i.e., amines, sulfhydryls, carboxyls, etc.), which subsequently allow for conjugation of nanoparticles to targeting moieties (e.g., monoclonal antibodies).

Contrast agents for use in the present invention also include a "tether" that couples the SPIO core to a desired ligand or additional SPIO cores. An exemplary tether includes a piezoelectric zinc oxide nanospring, such as those described, for example, by P. X. Gao and Z. L. Wang in "High-Yield Synthesis of Single-Crystal Nanosprings of ZnO" Small, 1:945-949 (2005); by X. Y. Kong and Z. L. Wang in "Polar-surface dominated ZnO Nanobelts and the Electrostatic Energy Induced Nanohelixes, Nanosprings, and Nanospirals," *Appl. Phys. Letts.*, 84:975-977 (2004); and by X. Y. Kong and Z. L. Wang in "Spontaneous Polarization-induced Nanohelixes, Nanosprings, and Nanorings of Piezoelectric Nanobelts", Nano Letters, 3:1625-1631 (2003). When the SPIO-based contrast agent is subjected to the spin-locking field, $B_{1\rho}$, the piezoelectric tether oscillates between a contracted and relaxed position at the spin-locking frequency, $\omega_R$. Being attached to the oscillating tether, the SPIO core perturbs the surrounding magnetic field at a corresponding frequency. Since the perturbations in the external magnetic field occur at the spin-lock frequency, $\omega_R$ they give rise to $T_{1\rho}$ relaxation in the spin-lock prepared magnetization. SPIO-based contrast agents are particularly useful to enhance the sensitivity to image tissue microcirculation with the goal of direct quantitative measurement of blood flow and blood volume, particularly in the functional imaging of human brain activity. Furthermore, specific sites in the brain can be targeted by conjugation of the contrast agent to targeting moieties and passage of the contrast agent across the blood-brain barrier.

The blood vessels of the brain, referred to collectively as the blood-brain barrier ("BBB"), are unique when compared to the blood vessels found in the periphery of the body. Tight apposition of BBB endothelial cells (EC) to neural cells like astrocytes, pericytes, and neurons induces phenotypic features that contribute to the observed impermeability. Tight junctions between ECs comprising the BBB limit paracellular transport, while the lack of pinocytotic vesicles and fenestrae limit non-specific transcellular transport. These factors combine to restrict molecular flux from the blood to the brain to those molecules that are less than 500 daltons and also lipophilic. Thus, using the large mass transfer surface area (over 21 $m^2$ from 400 miles of capillaries in human brain) of the bloodstream as a delivery vehicle is largely infeasible.

The present invention may utilize a variety of brain delivery methodologies to circumvent the BBB so that a contrast agent may be delivered to desired sites in the brain. For example, contrast agents useful in the present invention may be directly delivered to the brain by intra-cranial injection, such as injection into the brain ventricles. Alternatively, the BBB may be disrupted using, for example, hyperosmolar solutions or vasoactive agents like serotonin and bradykinin peptides to allow free passage of contrast agents from the blood to the brain. As well, the invention may utilize ophthalmic delivery of contrast agents using methods such as those described in PCT Application No. US08/071,581, incorporated by reference herein.

In certain brain delivery methodologies, active targeting is utilized to localize a contrast agent at brain specific sites to generate improved contrast for MR detection. Various methodologies are available to effectively enhance MR sensitivity by improving the site-specific accumulation of magnetic nanoparticles. Such methods include both passive, carrier-based transport, and active, receptor-mediated approaches. For example, brain delivery by receptor-mediated transport involves the binding of an exofacial epitope of a cell surface receptor and triggering of an energy intensive transcellular transport process known as transcytosis. Contrast agents can be delivered using these portals if conjugated to the natural ligand or an antibody that can trigger the transcytosis process. This method has been successful in previously allowing for non-invasive transport of small molecules, proteins, genes, nanoparticles, and liposomes. The receptors that are commonly targeted for transcytosis are the low density lipoprotein ("LDL") receptor, the transferrin receptor, and the insulin receptor. Similar less specific processes involving absorptive-mediated transcytosis have been used with cationized proteins that promote receptor clustering and activation of the transcytosis pathway. Such strategies generally target the cell surface receptor in ways that do not disrupt the normal transport of endogenous ligand. Therefore the impact on normal metabolic pathways is limited.

Antibodies are particularly well suited for targeting BBB receptor-mediated transcytosis systems given their high affinity and specificity for their ligands. As examples, appropriately-targeted antibodies that recognize extracellular epitopes of the insulin and transferrin receptors can act as artificial transporter substrates that are effectively transported across the BBB and deposited into the brain interstitium via the trans-endothelial route. Accordingly, when conjugated to contrast agents, the BBB targeting antibodies are capable of mediating brain uptake of the respective contrast agent. Anti-transferrin receptor conjugated magnetic nanoparticles are a particularly preferred method of brain delivery and methods of producing such materials are known in the field. Yet other antibodies useful for directing contrast agents across the BBB targeting are described by Shusta et al. in U.S. Published Patent Application 2008/0019984, incorporated herein by reference. Shusta et al. describe the characterization of single chain antibodies capable of targeting the BBB and transporting a conjugated cargo across the barrier by transcytosis.

General methods of conjugating, linking and coupling antibodies to other chemical entities are well known in the field. For example, see, Wu A M, Senter P D, Nat. Biotechnol. 2005 September; 23(9):1137-46; Trail P A. King H D. Dubowchik G M., Cancer Zmmunol Zmmunothel: 2003 May; 52(5):328-37; Saito G, Swanson J A, Lee K D., Adv Drug Deliv Rev. 2003 Feb. 10; 55(2): 199-215; Sugano et al., Cancer Research 60, 6942-6949, Dec. 15, 2000 and Martin et al., Nanomaterials in Analytical Chemistry, Analytical Chemisty News & Features, May 1, 1998; pp. 322 A-327 A; Thorek, D. L. J., et al., Ann Biomed Eng. 2006 January; 34(1):23-38; Kim D. K., et al. J Magn Magn Mater 225(1-2), 2001, pp. 256-261; Neumaier, C. E., et al., Tumori. 2008 March-April; 94(2):226-33; and A. M. Derfus, et al., Adv. Mater. 19:3939-3936 (2007). More specifically, the preparation and use of magnetically labeled antibodies, particularly monoclonal antibodies ("mAbs"), is known in the field. Immunoglobulins are routinely linked to iron oxide by a variety of methods including, e.g., attaching mAbs to magnetic nanoparticles via glutaraldehyde cross-linking (Renshaw P. F., et al., Magn Reson Imag, 4: 351-357, 1986), complexing through ultrasonication (Cerdan S., et al., Magn Reson Med, 12: 151-163, 1989; and Suwa T., et al., Int J Cancer, 75: 626-634, 1998), using the biotin-streptavidin system (Artemov D, et al., Cancer Res, 63: 2723-2727, 2003; and Bulte J. W., et al. Magn Reson Med, 25: 148-157, 1992), and amine-sulfhydrylgroup linkage (Tiefenauer L. X., et al., Bioconjug Chem, 4: 347-352, 1993; and Tiefenauer L. X., et al., Magn Reson Imaging, 14: 391-402, 1996). As used herein, the phrases "antibody in combination with a contrast agent", "antibody in combination with a nanoparticle", or the like, shall not be limited by the method of manufacture and such compositions may be produced by, but not limited to, techniques of conjugating, linking, coupling and decorating known in the art.

Figure 3:
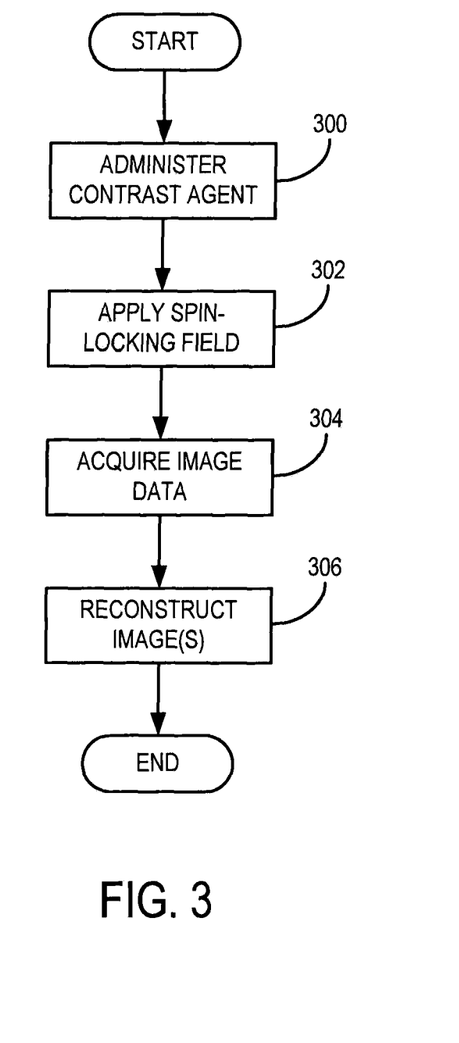
FIG. 3 is a flowchart setting forth the steps for one embodiment of the present invention using the MRI system of FIG. 1 and the pulse sequence of FIG. 2.

Referring now particularly to FIG. 3, an embodiment of the present invention begins by administering a contrast agent to a subject, as indicated at step 300. As described above, this may include intracranial, ophthalmic, or intravenous delivery of the contrast agent to the subject. After the administration of the contrast agent, the subject is imaged using, for example, the pulse sequence described above with reference to FIG. 2. Therefore, a spin-lock preparation method is first employed to establish a contrast mechanism in subsequently acquired image data, as indicated at step 302. As described above, spin-lock preparation includes the application of a spin-locking field, $B_{1\rho}$, which oscillates at a resonance frequency, $\omega_R$, the so-called "spin-lock" frequency. This oscillating magnetic field induces a mechanical resonance in the administered contrast agent that, in turn, affects the spin-locked magnetization and provides an enhanced image contrast mechanism. For example, the piezoelectric tether included in the SPIO-based contrast agent is responsive to the oscillating spin-locking field, $B_{1\rho}$. This field has the effect of inducing mechanical contractions and relaxations in the piezoelectric tether, to which a SPIO is affixed. In turn, this oscillates the SPIO at the spin-lock frequency, $\omega_R$. Because the SPIO core is superparamagnetic, it affects the external magnetic field. Moreover, since the SPIO core oscillates at the spin-lock frequency, $\omega_R$, the resulting perturbations in the external magnetic field oscillate at the same frequency, $\omega_R$. Because the external magnetic fields adjacent the resonating SPIO-based contrast agent are oscillating at the spin-lock frequency, $\omega_R$, they have the effect of saturating the spin-locked magnetization produced by the spin-lock preparation. In this manner, the contrast agent produced an effective reduction in signal intensity responsive to the spin-locking preparation.

Accordingly, image data is subsequently acquired at step 304. From the acquired data, images are reconstructed, as indicated at step 306. This is a conventional image reconstruction, such as a method employing Fourier transformation of the acquired image data. It will be appreciated by those skilled in the art that the image reconstruction method employed will vary depending on the manner in which data is acquired. For example, if a spiral k-space sampling pattern is utilized, image data is regridded prior to Fourier transformation.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps comprising:
   a) administering a contrast agent to the subject;
   b) applying with the MRI system, a spin-lock radiofrequency (RF) field that establishes a spin-lock condition in transverse magnetization such that the transverse magnetization in the spin-lock condition is saturated by magnetic fields generated by oscillatory motion of the contrast agent, wherein the magnetic fields generated by the oscillatory motion of the contrast agent oscillate at a frequency of the oscillatory motion;
   c) acquiring with the MRI system, image data from magnetic resonance signals that are indicative of the transverse magnetization in the spin-lock condition as it is saturated by the magnetic fields generated by the oscillatory motion of the contrast agent; and
   d) reconstructing, from the acquired image data, an image indicative of the contrast agent.

2. The method as recited in claim 1 in which step b) further includes:
   i) applying a first RF excitation pulse that tips spin magnetization from a longitudinal axis to a transverse plane prior to establishing the spin-lock condition with the spin-lock RF field; and
   ii) applying a second RF excitation pulse that tips the spin magnetization from the transverse plane to the longitudinal axis.

3. The method as recited in claim 1 in which step a) includes at least one of intracranial and intravenous injection of the contrast agent.

4. The method as recited in claim 1 in which the oscillatory motion of the contrast agent is produced by the spin-lock RF field.

5. The method as recited in claim 1 in which an amplitude of the spin-lock RF field is set to establish a Larmor frequency in a rotating frame of transverse magnetization that is substantially similar to the frequency of the oscillatory motion of the contrast agent.

6. The method as recited in claim 1 in which the spin-lock RF field is applied for a time period during which the magnetic fields having a frequency matched to the frequency of the spin-lock RF field are produced by the contrast agent, and in which the produced magnetic fields saturate the transverse magnetization in the spin-lock condition.

7. The method as recited in claim 6 in which the produced magnetic fields saturate the transverse magnetization in the spin-lock condition by inducing $T_{1\rho}$ relaxation in the transverse magnetization in the spin-lock condition, wherein $T_{1\rho}$ is a characteristic time for spin-locked magnetization relaxing to align within a rotating frame of the spin-lock RF field.

8. The method as recited in claim 1 in which the contrast agent includes a superparamagnetic nanoparticle.

9. The method as recited in claim 8 in which the contrast agent further includes a piezoelectric nanospring.

10. The method as recited in claim 9 in which the superparamagnetic nanoparticle is coupled to the piezoelectric nanospring.

11. The method as recited in claim 9 in which the superparamagnetic nanoparticle is an iron oxide superparamagnetic nanoparticle and the piezoelectric nanospring is a zinc oxide piezoelectric nanospring.

12. The method as recited in claim 1 in which step a) includes transferring the contrast agent across a blood-brain barrier.

13. The method as recited in claim 12 in which the contrast agent is transferred across the blood-brain barrier using at least one of a hyperosmolar solution, a vasoactive agent, and an ophthalmic delivery.

14. The method as recited in claim 12 in which the contrast agent is transferred across the blood-brain barrier using at least one of a passive carrier-based transport method and an active receptor-mediated method.

* * * * *